United States Patent
Jakab et al.

(10) Patent No.: US 7,948,769 B2
(45) Date of Patent: May 24, 2011

(54) TIGHTLY-COUPLED PCB GNSS CIRCUIT AND MANUFACTURING METHOD

(75) Inventors: Andrew J. Jakab, Calgary (CA); Nicholas J. Boorman, Calgary (CA)

(73) Assignee: Hemisphere GPS LLC, Calgary (CA)

( * ) Notice: Subject to any disclaimer, the term of this patent is extended or adjusted under 35 U.S.C. 154(b) by 411 days.

(21) Appl. No.: 12/239,312

(22) Filed: Sep. 26, 2008

(65) Prior Publication Data

US 2009/0085815 A1 Apr. 2, 2009

Related U.S. Application Data

(60) Provisional application No. 60/975,727, filed on Sep. 27, 2007.

(51) Int. Cl.
*H05K 7/06* (2006.01)
*H04B 7/08* (2006.01)

(52) U.S. Cl. ........................ 361/799; 455/272
(58) Field of Classification Search ................ 333/24 R; 361/679.01, 748, 760, 767, 782, 784, 792; 455/272

See application file for complete search history.

(56) References Cited

U.S. PATENT DOCUMENTS

| | | |
|---|---|---|
| 3,585,537 A | 6/1971 | Rennick et al. |
| 3,596,228 A | 7/1971 | Reed, Jr. et al. |
| 3,727,710 A | 4/1973 | Sanders et al. |
| 3,815,272 A | 6/1974 | Marleau |
| 3,899,028 A | 8/1975 | Morris et al. |
| 3,987,456 A | 10/1976 | Gelin |
| 4,132,272 A | 1/1979 | Holloway et al. |
| 4,170,776 A | 10/1979 | MacDoran |
| 4,180,133 A | 12/1979 | Collogan et al. |
| 4,398,162 A | 8/1983 | Nagai |
| 4,453,614 A | 6/1984 | Allen et al. |
| 4,529,990 A | 7/1985 | Brunner |
| 4,637,474 A | 1/1987 | Leonard |
| 4,667,203 A | 5/1987 | Counselman, III |
| 4,689,556 A | 8/1987 | Cedrone |

(Continued)

FOREIGN PATENT DOCUMENTS

JP 07244150 9/1995

(Continued)

OTHER PUBLICATIONS

Takac, Frank et al., "SmartRTK: A Novel Method Of Processing Standardised RTCM Network RTK Information For High Precision Positioning", *Proceedings of ENC GNSS 2008*, Toulouse, France,(Apr. 22, 2008).

(Continued)

*Primary Examiner* — Dean O Takaoka
(74) *Attorney, Agent, or Firm* — Law Office of Mark Brown, LLC; Mark E. Brown

(57) ABSTRACT

A tightly-coupled printed circuit board (PCB) circuit includes components mounted on a PCB enabling smaller integrations using decoupled lines extending between reference layers, such as ground planes, form isolation islands on the PCB. The decouplers are capacitors, inductors and/or resistors in tandem with ground layers of the PCB. The isolated components can comprise high-frequency RF antennas and receivers, for example in a GNSS antenna-receiver circuit. Multiple antennas can be connected to one for more receivers with multiple, independent RF front end components by RF traces, which are either embedded within the PCB between the ground planes, or by surface microstrip antenna traces.

15 Claims, 4 Drawing Sheets

U.S. PATENT DOCUMENTS

| | | |
|---|---|---|
| 4,694,264 A | 9/1987 | Owens et al. |
| 4,710,775 A | 12/1987 | Coe |
| 4,714,435 A | 12/1987 | Stipanuk et al. |
| 4,739,448 A | 4/1988 | Rowe et al. |
| 4,751,512 A | 6/1988 | Longaker |
| 4,769,700 A | 9/1988 | Pryor |
| 4,785,463 A | 11/1988 | Janc et al. |
| 4,802,545 A | 2/1989 | Nystuen et al. |
| 4,812,991 A | 3/1989 | Hatch |
| 4,813,991 A | 3/1989 | Hatch |
| 4,858,132 A | 8/1989 | Holmquist |
| 4,864,320 A | 9/1989 | Munson et al. |
| 4,894,662 A | 1/1990 | Counselman |
| 4,916,577 A | 4/1990 | Dawkins |
| 4,918,607 A | 4/1990 | Wible |
| 4,963,889 A | 10/1990 | Hatch |
| 5,031,704 A | 7/1991 | Fleischer et al. |
| 5,100,229 A | 3/1992 | Lundberg et al. |
| 5,134,407 A | 7/1992 | Lorenz et al. |
| 5,148,179 A | 9/1992 | Allison |
| 5,152,347 A | 10/1992 | Miller |
| 5,155,490 A | 10/1992 | Spradley et al. |
| 5,155,493 A | 10/1992 | Thursby et al. |
| 5,156,219 A | 10/1992 | Schmidt et al. |
| 5,165,109 A | 11/1992 | Han et al. |
| 5,173,715 A | 12/1992 | Rodal et al. |
| 5,177,489 A | 1/1993 | Hatch |
| 5,185,610 A | 2/1993 | Ward et al. |
| 5,191,351 A | 3/1993 | Hofer et al. |
| 5,202,829 A | 4/1993 | Geier |
| 5,207,239 A | 5/1993 | Schwitalia |
| 5,239,669 A | 8/1993 | Mason et al. |
| 5,255,756 A | 10/1993 | Follmer et al. |
| 5,268,695 A | 12/1993 | Dentinger et al. |
| 5,293,170 A | 3/1994 | Lorenz et al. |
| 5,294,970 A | 3/1994 | Dornbusch et al. |
| 5,296,861 A | 3/1994 | Knight |
| 5,311,149 A | 5/1994 | Wagner et al. |
| 5,323,322 A | 6/1994 | Mueller et al. |
| 5,334,987 A | 8/1994 | Teach |
| 5,343,209 A | 8/1994 | Sennott et al. |
| 5,345,245 A | 9/1994 | Ishikawa et al. |
| 5,359,332 A | 10/1994 | Allison et al. |
| 5,361,212 A | 11/1994 | Class et al. |
| 5,365,447 A | 11/1994 | Dennis |
| 5,369,589 A | 11/1994 | Steiner |
| 5,375,059 A | 12/1994 | Kyrtsos et al. |
| 5,390,124 A | 2/1995 | Kyrtsos |
| 5,390,125 A | 2/1995 | Sennott et al. |
| 5,390,207 A | 2/1995 | Fenton et al. |
| 5,416,712 A | 5/1995 | Geier et al. |
| 5,442,363 A | 8/1995 | Remondi |
| 5,444,453 A | 8/1995 | Lalezari |
| 5,451,964 A | 9/1995 | Babu |
| 5,467,282 A | 11/1995 | Dennis |
| 5,471,217 A | 11/1995 | Hatch et al. |
| 5,476,147 A | 12/1995 | Fixemer |
| 5,477,228 A | 12/1995 | Tiwari et al. |
| 5,477,458 A | 12/1995 | Loomis |
| 5,490,073 A | 2/1996 | Kyrtsos |
| 5,491,636 A | 2/1996 | Robertson |
| 5,495,257 A | 2/1996 | Loomis |
| 5,504,482 A | 4/1996 | Schreder |
| 5,511,623 A | 4/1996 | Frasier |
| 5,519,620 A | 5/1996 | Talbot et al. |
| 5,521,610 A | 5/1996 | Rodal |
| 5,523,761 A | 6/1996 | Gildea |
| 5,534,875 A | 7/1996 | Diefes et al. |
| 5,543,804 A | 8/1996 | Buchler et al. |
| 5,546,093 A | 8/1996 | Gudat et al. |
| 5,548,293 A | 8/1996 | Cohen et al. |
| 5,561,432 A | 10/1996 | Knight |
| 5,563,786 A | 10/1996 | Torii |
| 5,568,152 A | 10/1996 | Janky et al. |
| 5,568,162 A | 10/1996 | Samsel et al. |
| 5,583,513 A | 12/1996 | Cohen |
| 5,589,835 A | 12/1996 | Gildea et al. |
| 5,592,382 A | 1/1997 | Colley |
| 5,596,328 A | 1/1997 | Stangeland et al. |
| 5,600,670 A | 2/1997 | Turney |
| 5,604,506 A | 2/1997 | Rodal |
| 5,608,393 A | 3/1997 | Hartman |
| 5,610,522 A | 3/1997 | Locatelli et al. |
| 5,610,616 A | 3/1997 | Vallot et al. |
| 5,610,845 A | 3/1997 | Slabinski |
| 5,612,883 A | 3/1997 | Shaffer et al. |
| 5,615,116 A | 3/1997 | Gudat et al. |
| 5,617,100 A | 4/1997 | Akiyoshi et al. |
| 5,617,317 A | 4/1997 | Ignagni |
| 5,621,646 A | 4/1997 | Enge et al. |
| 5,638,077 A | 6/1997 | Martin |
| 5,644,139 A | 7/1997 | Allen et al. |
| 5,664,632 A | 9/1997 | Frasier |
| 5,673,491 A | 10/1997 | Brenna et al. |
| 5,680,140 A | 10/1997 | Loomis |
| 5,684,696 A | 11/1997 | Rao et al. |
| 5,706,015 A | 1/1998 | Chen et al. |
| 5,717,593 A | 2/1998 | Gvili |
| 5,725,230 A | 3/1998 | Walkup |
| 5,731,786 A | 3/1998 | Abraham et al. |
| 5,739,785 A | 4/1998 | Allison et al. |
| 5,757,316 A | 5/1998 | Buchler |
| 5,765,123 A | 6/1998 | Nimura et al. |
| 5,777,578 A | 7/1998 | Chang et al. |
| 5,810,095 A | 9/1998 | Orbach et al. |
| 5,828,336 A | 10/1998 | Yunck et al. |
| 5,838,562 A | 11/1998 | Gudat et al. |
| 5,854,987 A | 12/1998 | Sekine et al. |
| 5,862,501 A | 1/1999 | Talbot et al. |
| 5,864,315 A | 1/1999 | Welles, II et al. |
| 5,864,318 A | 1/1999 | Cozenza et al. |
| 5,875,408 A | 2/1999 | Pinto |
| 5,877,725 A | 3/1999 | Kalafus |
| 5,890,091 A | 3/1999 | Talbot et al. |
| 5,899,957 A | 5/1999 | Loomis |
| 5,906,645 A | 5/1999 | Kagawa et al. |
| 5,912,798 A | 6/1999 | Chu |
| 5,914,685 A | 6/1999 | Kozlov et al. |
| 5,917,448 A | 6/1999 | Mickelson |
| 5,918,558 A | 7/1999 | Susag |
| 5,919,242 A | 7/1999 | Greatline et al. |
| 5,923,270 A | 7/1999 | Sampo et al. |
| 5,926,079 A | 7/1999 | Heine et al. |
| 5,927,603 A | 7/1999 | McNabb |
| 5,928,309 A | 7/1999 | Korver et al. |
| 5,929,721 A | 7/1999 | Munn et al. |
| 5,933,110 A | 8/1999 | Tang |
| 5,935,183 A | 8/1999 | Sahm et al. |
| 5,936,573 A | 8/1999 | Smith |
| 5,940,026 A | 8/1999 | Popeck |
| 5,941,317 A | 8/1999 | Mansur |
| 5,943,008 A | 8/1999 | Van Dusseldorf |
| 5,944,770 A | 8/1999 | Enge et al. |
| 5,945,917 A | 8/1999 | Harry |
| 5,949,371 A | 9/1999 | Nichols |
| 5,955,973 A | 9/1999 | Anderson |
| 5,956,250 A | 9/1999 | Gudat et al. |
| 5,969,670 A | 10/1999 | Kalafus et al. |
| 5,987,383 A | 11/1999 | Keller et al. |
| 6,014,101 A | 1/2000 | Loomis |
| 6,014,608 A | 1/2000 | Seo |
| 6,018,313 A | 1/2000 | Englemayer et al. |
| 6,023,239 A | 2/2000 | Kovach |
| 6,052,647 A | 4/2000 | Parkinson et al. |
| 6,055,477 A | 4/2000 | McBurney et al. |
| 6,057,800 A | 5/2000 | Yang et al. |
| 6,061,390 A | 5/2000 | Meehan et al. |
| 6,061,632 A | 5/2000 | Dreier |
| 6,062,317 A | 5/2000 | Gharsalli |
| 6,069,583 A | 5/2000 | Silvestrin et al. |
| 6,076,612 A | 6/2000 | Carr et al. |
| 6,081,171 A | 6/2000 | Ella |
| 6,100,842 A | 8/2000 | Dreier et al. |
| 6,122,595 A | 9/2000 | Varley et al. |
| 6,128,574 A | 10/2000 | Diekhans |
| 6,144,335 A | 11/2000 | Rogers et al. |
| 6,191,730 B1 | 2/2001 | Nelson, Jr. |

| Patent | Date | Name |
|---|---|---|
| 6,191,733 B1 | 2/2001 | Dizchavez |
| 6,198,430 B1 | 3/2001 | Hwang et al. |
| 6,198,992 B1 | 3/2001 | Winslow |
| 6,199,000 B1 | 3/2001 | Keller et al. |
| 6,205,401 B1 | 3/2001 | Pickhard et al. |
| 6,215,828 B1 | 4/2001 | Signell et al. |
| 6,229,479 B1 | 5/2001 | Kozlov et al. |
| 6,230,097 B1 | 5/2001 | Dance et al. |
| 6,233,511 B1 | 5/2001 | Berger et al. |
| 6,236,916 B1 | 5/2001 | Staub et al. |
| 6,236,924 B1 | 5/2001 | Motz |
| 6,253,160 B1 | 6/2001 | Hanseder |
| 6,256,583 B1 | 7/2001 | Sutton |
| 6,259,398 B1 | 7/2001 | Riley |
| 6,266,595 B1 | 7/2001 | Greatline et al. |
| 6,285,320 B1 | 9/2001 | Olster et al. |
| 6,292,132 B1 | 9/2001 | Wilson |
| 6,307,505 B1 | 10/2001 | Green |
| 6,313,788 B1 | 11/2001 | Wilson |
| 6,314,348 B1 | 11/2001 | Winslow |
| 6,325,684 B1 | 12/2001 | Knight |
| 6,336,066 B1 | 1/2002 | Pellenc et al. |
| 6,345,231 B2 | 2/2002 | Quincke |
| 6,356,602 B1 | 3/2002 | Rodal et al. |
| 6,377,889 B1 | 4/2002 | Soest |
| 6,380,888 B1 | 4/2002 | Kucik |
| 6,389,345 B2 | 5/2002 | Phelps |
| 6,392,589 B1 | 5/2002 | Rogers et al. |
| 6,397,147 B1 | 5/2002 | Whitehead et al. |
| 6,415,229 B1 | 7/2002 | Diekhans |
| 6,418,031 B1 | 7/2002 | Archambeault |
| 6,421,003 B1 | 7/2002 | Riley et al. |
| 6,424,915 B1 | 7/2002 | Fukuda et al. |
| 6,431,576 B1 | 8/2002 | Viaud et al. |
| 6,434,462 B1 | 8/2002 | Bevly et al. |
| 6,445,983 B1 | 9/2002 | Dickson et al. |
| 6,445,990 B1 | 9/2002 | Manring |
| 6,449,558 B1 | 9/2002 | Small |
| 6,463,091 B1 | 10/2002 | Zhodzicshsky et al. |
| 6,463,374 B1 | 10/2002 | Keller et al. |
| 6,466,871 B1 | 10/2002 | Reisman et al. |
| 6,469,663 B1 | 10/2002 | Whitehead et al. |
| 6,484,097 B2 | 11/2002 | Fuchs et al. |
| 6,501,422 B1 | 12/2002 | Nichols |
| 6,515,619 B1 | 2/2003 | McKay, Jr. |
| 6,516,271 B2 | 2/2003 | Upadhyaya et al. |
| 6,539,303 B2 | 3/2003 | McClure et al. |
| 6,542,077 B2 | 4/2003 | Joao |
| 6,549,835 B2 | 4/2003 | Deguchi |
| 6,553,299 B1 | 4/2003 | Keller et al. |
| 6,553,300 B2 | 4/2003 | Ma et al. |
| 6,553,311 B2 | 4/2003 | Aheam et al. |
| 6,570,534 B2 | 5/2003 | Cohen et al. |
| 6,577,952 B2 | 6/2003 | Geier et al. |
| 6,587,761 B2 | 7/2003 | Kumar |
| 6,606,542 B2 | 8/2003 | Hauwiller et al. |
| 6,611,228 B2 | 8/2003 | Toda et al. |
| 6,611,754 B2 | 8/2003 | Klein |
| 6,611,755 B1 | 8/2003 | Coffee et al. |
| 6,622,091 B2 | 9/2003 | Perlmutter et al. |
| 6,631,916 B1 | 10/2003 | Miller |
| 6,643,576 B1 | 11/2003 | O'Connor et al. |
| 6,646,603 B2 | 11/2003 | Dooley et al. |
| 6,657,875 B1 | 12/2003 | Zeng et al. |
| 6,671,587 B2 | 12/2003 | Hrovat et al. |
| 6,688,403 B2 | 2/2004 | Bernhardt et al. |
| 6,703,973 B1 | 3/2004 | Nichols |
| 6,711,501 B2 | 3/2004 | McClure et al. |
| 6,721,638 B2 | 4/2004 | Zeitler |
| 6,732,024 B2 | 5/2004 | Rekow et al. |
| 6,744,404 B1 | 6/2004 | Whitehead et al. |
| 6,754,584 B2 | 6/2004 | Pinto et al. |
| 6,774,843 B2 | 8/2004 | Takahashi |
| 6,792,380 B2 | 9/2004 | Toda |
| 6,819,269 B2 | 11/2004 | Flick |
| 6,822,314 B2 | 11/2004 | Beasom |
| 6,865,465 B2 | 3/2005 | McClure |
| 6,865,484 B2 | 3/2005 | Miyasaka et al. |
| 6,900,992 B2 | 5/2005 | Kelly et al. |
| 6,922,635 B2 | 7/2005 | Rorabaugh |
| 6,931,233 B1 | 8/2005 | Tso et al. |
| 6,967,538 B2 | 11/2005 | Woo |
| 6,990,399 B2 | 1/2006 | Hrazdera et al. |
| 7,006,032 B2 | 2/2006 | King et al. |
| 7,026,982 B2 | 4/2006 | Toda et al. |
| 7,027,918 B2 | 4/2006 | Zimmerman et al. |
| 7,031,725 B2 | 4/2006 | Rorabaugh |
| 7,089,099 B2 | 8/2006 | Shostak et al. |
| 7,142,956 B2 | 11/2006 | Heiniger et al. |
| 7,162,348 B2 | 1/2007 | McClure et al. |
| 7,191,061 B2 | 3/2007 | McKay et al. |
| 7,231,290 B2 | 6/2007 | Steichen et al. |
| 7,248,211 B2 | 7/2007 | Hatch et al. |
| 7,271,766 B2 | 9/2007 | Zimmerman et al. |
| 7,277,784 B2 | 10/2007 | Weiss |
| 7,292,186 B2 | 11/2007 | Miller et al. |
| 7,324,915 B2 | 1/2008 | Altman |
| 7,358,896 B2 | 4/2008 | Gradincic et al. |
| 7,373,231 B2 | 5/2008 | McClure et al. |
| 7,388,539 B2 | 6/2008 | Whitehead et al. |
| 7,395,769 B2 | 7/2008 | Jensen |
| 7,428,259 B2 | 9/2008 | Wang et al. |
| 7,437,230 B2 | 10/2008 | McClure et al. |
| 7,451,030 B2 | 11/2008 | Eglington et al. |
| 7,479,900 B2 | 1/2009 | Horstemeyer |
| 7,505,848 B2 | 3/2009 | Flann et al. |
| 7,522,100 B2 | 4/2009 | Yang et al. |
| 7,571,029 B2 | 8/2009 | Dai et al. |
| 7,689,354 B2 | 3/2010 | Heiniger et al. |
| 7,839,334 B2 * | 11/2010 | Rofougaran ........... 343/700 MS |
| 2003/0014171 A1 | 1/2003 | Ma et al. |
| 2003/0187560 A1 | 10/2003 | Keller et al. |
| 2003/0208319 A1 | 11/2003 | Ell et al. |
| 2004/0039514 A1 | 2/2004 | Steichen et al. |
| 2004/0212533 A1 | 10/2004 | Whitehead et al. |
| 2005/0080559 A1 | 4/2005 | Ishibashi et al. |
| 2005/0225955 A1 | 10/2005 | Grebenkemper et al. |
| 2005/0265494 A1 | 12/2005 | Goodlings |
| 2006/0167600 A1 | 7/2006 | Nelson et al. |
| 2006/0215739 A1 | 9/2006 | Williamson et al. |
| 2006/0251173 A1 | 11/2006 | Wang et al. |
| 2007/0078570 A1 | 4/2007 | Dai et al. |
| 2007/0088447 A1 | 4/2007 | Stothert et al. |
| 2007/0121708 A1 | 5/2007 | Simpson |
| 2007/0205940 A1 | 9/2007 | Yang et al. |
| 2007/0285308 A1 | 12/2007 | Bauregger et al. |
| 2008/0129586 A1 | 6/2008 | Martin |
| 2008/0170378 A1* | 7/2008 | Ou-Yang .................. 361/799 |
| 2008/0204312 A1 | 8/2008 | Euler |
| 2009/0171583 A1 | 7/2009 | DiEsposti |
| 2009/0174587 A1 | 7/2009 | DiLellio et al. |
| 2009/0174622 A1 | 7/2009 | Kanou |
| 2009/0177395 A1 | 7/2009 | Stelpstra |
| 2009/0177399 A1 | 7/2009 | Park et al. |
| 2009/0259397 A1 | 10/2009 | Stanton |
| 2009/0259707 A1 | 10/2009 | Martin et al. |
| 2009/0262014 A1 | 10/2009 | DiEsposti |
| 2009/0262018 A1 | 10/2009 | Vasilyev et al. |
| 2009/0262974 A1 | 10/2009 | Lithopoulos |
| 2009/0265054 A1 | 10/2009 | Basnayake |
| 2009/0265101 A1 | 10/2009 | Jow |
| 2009/0265104 A1 | 10/2009 | Shroff |
| 2009/0273372 A1 | 11/2009 | Brenner |
| 2009/0273513 A1 | 11/2009 | Huang |
| 2009/0274079 A1 | 11/2009 | Bhatia et al. |
| 2009/0274113 A1 | 11/2009 | Katz |
| 2009/0276155 A1 | 11/2009 | Jeerage et al. |
| 2009/0295633 A1 | 12/2009 | Pinto et al. |
| 2009/0295634 A1 | 12/2009 | Yu et al. |
| 2009/0299550 A1 | 12/2009 | Baker |
| 2009/0322597 A1 | 12/2009 | Medina Herrero et al. |
| 2009/0322598 A1 | 12/2009 | Fly et al. |
| 2009/0322600 A1 | 12/2009 | Whitehead et al. |
| 2009/0322601 A1 | 12/2009 | Ladd et al. |
| 2009/0322606 A1 | 12/2009 | Gronemeyer |
| 2009/0326809 A1 | 12/2009 | Colley et al. |
| 2010/0013703 A1 | 1/2010 | Tekawy et al. |
| 2010/0026569 A1 | 2/2010 | Amidi |

| | | | |
|---|---|---|---|
| 2010/0030470 | A1 | 2/2010 | Wang et al. |
| 2010/0039316 | A1 | 2/2010 | Gronemeyer et al. |
| 2010/0039318 | A1 | 2/2010 | Kmiecik |
| 2010/0039320 | A1 | 2/2010 | Boyer et al. |
| 2010/0039321 | A1 | 2/2010 | Abraham |
| 2010/0060518 | A1 | 3/2010 | Bar-Sever et al. |
| 2010/0063649 | A1 | 3/2010 | Wu |
| 2010/0084147 | A1 | 4/2010 | Aral |
| 2010/0085249 | A1 | 4/2010 | Ferguson et al. |
| 2010/0085253 | A1 | 4/2010 | Ferguson et al. |
| 2010/0103033 | A1 | 4/2010 | Roh |
| 2010/0103034 | A1 | 4/2010 | Tobe et al. |
| 2010/0103038 | A1 | 4/2010 | Yeh et al. |
| 2010/0103040 | A1 | 4/2010 | Broadbent |
| 2010/0106414 | A1 | 4/2010 | Whitehead |
| 2010/0106445 | A1 | 4/2010 | Kondoh |
| 2010/0109944 | A1 | 5/2010 | Whitehead et al. |
| 2010/0109945 | A1 | 5/2010 | Roh |
| 2010/0109947 | A1 | 5/2010 | Rintanen |
| 2010/0109948 | A1 | 5/2010 | Razoumov et al. |
| 2010/0109950 | A1 | 5/2010 | Roh |
| 2010/0111372 | A1 | 5/2010 | Zheng et al. |
| 2010/0114483 | A1 | 5/2010 | Heo et al. |
| 2010/0117899 | A1 | 5/2010 | Papadimitratos et al. |
| 2010/0117900 | A1 | 5/2010 | van Diggelen et al. |

FOREIGN PATENT DOCUMENTS

| | | |
|---|---|---|
| WO | WO9836288 | 8/1998 |
| WO | WO0024239 | 5/2000 |
| WO | WO03019430 | 3/2003 |
| WO | WO2005/119386 | 12/2005 |
| WO | WO 2009/066183 | 5/2009 |
| WO | WO2009126587 | 10/2009 |
| WO | WO2009/148638 | 12/2009 |

OTHER PUBLICATIONS

"International Search Report", PCT/US09/33567, (Apr. 10, 2009).
"International Search Report and Written Opinion", PCT/IB2008/003796, (Jul. 21, 2009).
"International Search Report,", PCT/US09/34376, (Nov. 5, 2009).
Rho, Hyundho et al., "Dual-Frequency GPS Precise Point Positioning with WADGPS Corrections", [retrieved on May 18, 2010]. Retrieved from the Internet: ,URL: http://gauss.gge.unb.ca/papers.pdf/iongnss2005.rho.wadgps.pdf, (Jul. 12, 2006).
"Eurocontrol, Pegasus Technical Notes on SBAS", report [online], Dec. 7, 2004 [retrieved on May 18, 2010]. Retrieved from the Internet: <URL: http://www.icao.int/icao/en/ro/nacc/meetings/2004/gnss/documentation/Pegasus/tn.pdf>. (Dec. 7, 2004), p. 89 paras [0001]-[0004].
"ARINC Engineering Services, Interface Specification IS-GPS-200, Revision D", Online [retrieved on May 18, 2010]. Retrieved from the Internet; <URL: http://www.navcen.uscg.gov/gps/geninfo/IS-GPS-200D.pdf>. (Dec. 7, 2004), p. 168 para [0001].
Schaer, et al., "Determination and Use of GPS Differential Code Bias Values", Presentation [online]. Revtrieved May 18, 2010. Retrieved from the internet: <http://nng.esoc.esa.de/ws2006/REPR2.pdf>. (May 8, 2006).
"International Search Report", PCT/US10/26509, (Apr. 20, 2010).
Parkinson, Bradford W., et al., "Global Positioning System: Theory and Applications, vol. II", *Bradford W. Parkinson and James J. Spiker, Jr., eds.Global Postioning System: Theory and Applicaitons, vol. II, 1995, AIAA, Reston, VA, USA, pp. 3-50.* (1995),3-50.
"Orthman Manufacturing Co., www.orthman.com/htm;guidance.htm", 2004. regarding the "Tracer Quick-Hitch".
Lin, Dai et al., "Real-time Attitude Determination fro Microsatellite by Lamda Method Combined with Kalman Filtering", *A Collection fof the 22nd AIAA International Communications Satellite Systems Conference and Exhibit Technical Paers vol. 1. Monetrey, California American Institute of Aeronautics and Astronautics, Inc.*, (May 2004),136-143.
Xu, Jiangning et al., "An EHW Architecture for Real-Time GPS Attitude Determination Based on Parallel Genetic Algorithm", *The Computer SocietyProceedings of the 2002 NASA/DOD Conference on Evolvable Hardware* (EH'02), (2002).
Han, Shaowel et al., "Single-Epoch Ambiguity Resolution for Real-Time GPS Attitude Determination with the Aid of One-Dimensional Optical Fiber Gyro", *GPS Solutions*, vol. 3, No. 1, pp. 5-12 (1999) *John Wiley & Sons, Inc.*
Park, Chansik et al., "Integer Ambiguity Resolution for GPS Based Attitude Determination System", *SICE 1998*, Jul. 29-31, Chiba, 1115-1120.
Last, J.D., et al., "Effect of skywave interference on coverage of radiobeacon DGPS stations", *IEEE Proc.-Radar, Sonar Navig.*, vol. 144, No. 3, Jun. 1997, pp. 163-168.
"International Search Report and Written Opinion", PCT/US2004/015678, filed May 17, 2004, Jun. 21, 2005.
"ISO", *11783 Part 7 Draft Amendment 1 Annex, Paragraphs B.6 and B.7.ISO 11783-7 2004 DAM1.ISO: Mar. 8, 2004*.
Kaplan, E D., "Understanding GPS:Principles and Applications", *Artech House, MA*, 1996.
Irsigler, M et al., "PPL Tracking Performance in the Presence of Oscillator Phase Noise", *GPS Solutions*, vol. 5, No. 4. pp. 45-57 (2002).
Ward, Phillip W., "Performance Comparisons Between FLL, PLL and a Novel FLL-Assisted-PLL Carrier Tracking Loop Under RF Interference Conditions", *11th Int. Tech Meeting of the Satellite Division of the U.S. Inst. of Navigation*, Nashville, TN, Sep. 15-18, 783-795, 1998.
Bevly, David M., "Comparison of INS v. Carrier-Phase DGPS for Attitude Determination in the Control of Off-Road Vehicles", *ION 55th Annual Meeting: Jun. 28-30, 1999*; Cambridge, Massachusetts; pp. 497-504.
Keicher, R. et al., "Automatic Guidance for Agricultural Vehicles in Europe", *Computers and Electronics in Agriculture*, vol. 25, (Jan. 2000), 169-194.
"International Search Report", PCT/US09/49776, (Aug. 11, 2009).
"International Search Report", PCT/AU/2008/000002, (Feb. 28, 2008).
"International Search Report", PCT/US09/33693, (Mar. 30, 2009).
"International Search Report", PCT/US09/039686, (May 26, 2009).
"International Search Report / Written Opinion", PCT/US09/63594, (Jan. 11, 2010).
"International Search Report", PCT/US09/60668, (Dec. 9, 2009).
"International Search Report", PCT/US09/067693.
"International Search Report and Written Opinion", PCT/US10/21334, (Mar. 12, 2010).

* cited by examiner

TIGHTLY-COUPLED PCB GNSS CIRCUIT AND MANUFACTURING METHOD

CROSS-REFERENCE TO RELATED APPLICATION

This application claims the benefit of U.S. Provisional Application No. 60/975,727, filed Sep. 27, 2007, which is incorporated herein by reference.

BACKGROUND OF THE INVENTION

1. Field of the Invention

The present invention relates generally to printed circuit boards (PCBs), and in particular to a tightly-coupled PCB for mounting one or more receivers with multiple, independent radio frequency (RF) front ends in close proximity to multiple, respective antennas. The circuit is noise-filtered by electrically decoupling and isolating the conductive reference planes of the PCB.

2. Description of the Related Art

PCB manufacturing techniques are well-developed and enable the cost-effective production of circuits with virtually unlimited configurations and combinations of components. Typical PCB construction comprises one or more reference layers, which can provide power and ground (common) planar sources for the entire circuit. Component conductors are connected to the reference layers as required for their operation. Other layers conduct signals, and can be photo-etched with trace conductors linking other component conductors. Still further, microstrip traces can be mounted on the PCB surfaces or within the PCB layers for electrically coupling components.

Signal noise control represents a significant aspect of PCB circuit design. Such considerations are particularly significant in designing circuits with RF receiver and antenna components, because circuit noise from switching components, power sources, "skin effect" conductivity and other noise-producing elements can significantly interfere with the reception and processing of transmitted signals. For example, global navigation satellite system (GNSS, including global positioning system (GPS)) receivers operate in the microwave frequency range, whose high frequencies tend to increase noise-related reception problems and signal interference. For example, such systems are susceptible to multipath signal phenomena, which tend to reduce system accuracy and performance.

A previous solution has been to physically isolate the receiver and antenna components, which can be connected by a shielded RF cable. However, it is often more cost-effective to mount as many system components as possible on a single PCB. Moreover, locating the receiver and its antenna(s) in close proximity tends to improve performance by eliminating relatively lengthy RF connecting cables, provided the potential for noise interference can be controlled. "Smart" antennas combining antennas and receivers at single locations have previously been utilized, but do not electrically decouple the circuit components or utilize the ground reference planes for additional antenna area.

Therefore, the design criteria for GNSS receiver-antenna PCBs would preferably included minimizing overall size, placing the receiver and antenna components in close proximity, accommodating multiple antennas and controlling signal noise. Previous receiver-antenna PCBs and manufacturing methods have not provided the advantages and features of the present invention.

SUMMARY OF THE INVENTION

In the practice of an aspect of the present invention, a PCB is designed in a manner to isolate and control the inter-frequency noise sources, and provides for the use of components for decoupling reference layers thereof, which can further separate and decouple the ground planes. A receiver with multiple, independent RF front end components can be mounted on the PCB in close proximity to multiple antennas. The receiver and antennas are connected by optimized transmission lines embedded within the PCB between the ground planes, or by surface microstrip antenna traces. The impedance of the transmission lines is controlled during the process of manufacturing the PCB.

DETAILED DESCRIPTION OF THE PREFERRED EMBODIMENTS

I. Introduction and Environment

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Certain terminology will be used in the following description for convenience in reference only and will not be limiting. For example, up, down, front, back, right and left refer to the invention as oriented in the view being referred to. The words "inwardly" and "outwardly" refer to directions toward and away from, respectively, the geometric center of the embodiment being described and designated parts thereof. Said terminology will include the words specifically mentioned, derivatives thereof and words of similar meaning.

II. Tightly-Coupled PCB Circuit 2

Figure 1:
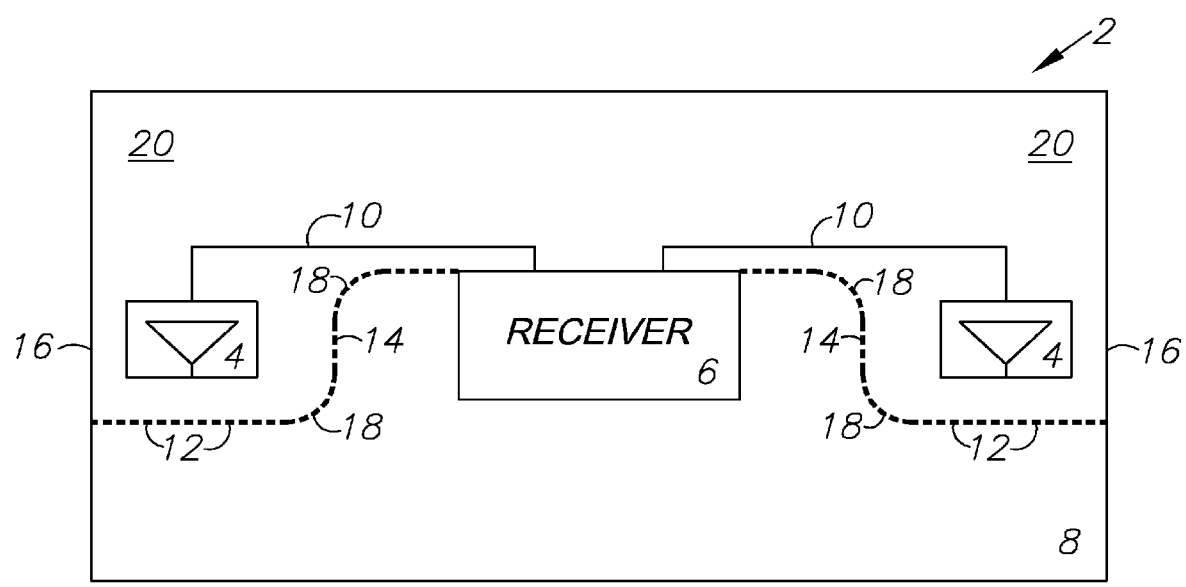
FIG. 1 is a schematic diagram of a tightly-coupled PCB circuit embodying an aspect of the present invention with a receiver and a pair of antennas located in proximity and trace-connected to each other on the PCB.

Referring to FIG. 1 of the drawings in more detail, the reference numeral 2 generally designates a tightly-coupled printed circuit board (PCB) circuit embodying an aspect of the present invention. Without limitation on the generality of tightly-coupled PCB circuits for which the present invention can be advantageously applied, the circuit 2 includes a pair of antennas 4 coupled to a sensing receiver 6. By way of example and without limitation, the receiver 6 can comprise a GNSS (e.g., GPS) receiver operating in the microwave frequency range.

The antennas 4 and the receiver 6 are mounted on a multi-layer PCB 8, which can include multiple conductive layers separated by insulating layers formed of epoxy or other suitable material. The conductive layers can include reference layers adapted for powering the circuit 2 via a positive, power layer and one or more ground or common layers providing a ground plane(s) for the circuit. The PCB 8 can also include one or more signal layers, which can be photo-etched in a suitable circuit diagram pattern(s) for electrically coupling the circuit components. For example, the antennas 4 and the receiver 6 can be connected by RF transmission striplines or traces 10, which can be either embedded within the PCB 8 and shielded between the reference layers thereof in a sandwiching construction, or located on the PCB 8 surface and comprise surface microstrip antenna traces. If surface-mounted, the RF transmission striplines 10 would be bottom-shielded by the top layer of the PCB 8. The function of the RF transmission striplines 10 is preferably optimized by controlling impedance (Z), e.g. by varying the thickness of the traces 10.

Multiple decouplers 12 form decoupling lines 14, which extend from the receiver 6 to respective ends 16 of the PCB 8. The lines 14 include bends 18 and form grounded isolation islands 20 which are relatively noise-free by virtue of the electrical decoupling function of the decouplers 12. The RF inputs via the antennas 4 are near the ends 16 of the PCB 8. The decoupling lines 14 can be formed with bends and other configurations as necessary in order to locate the RF input signals as close as possible to the physical RF connectors from within the RF transmission striplines 10 in order to provide optimal RF signal paths from the antennas 4 to the receiver 6. The decouplers 12 can comprise capacitors, resistors or inductors, which are chosen for impedance control based on characteristics and operating parameters of the circuit 2. The configurations and locations of the isolation islands 20 within the PCB also provide impedance control, in conjunction with the decoupling lines 14 and the operating parameters of the circuit 2. Such operating parameters can include such variables as power, voltage, current, frequency and amplitude of the signals encountered by the components of the circuit 2, including the operating ranges of such parameters. Multiple different capacitive values of the decouplers 12 can be utilized to filter specific frequencies between the decoupled component ground planes.

The decouplers 12 and the isolation islands 20 preferably extend between, yet still allow, electrical connections between the reference layers (e.g., ground planes and/or positive reference layer) of the PCB 8. The respective independent ground planes of the circuit components, such as the antennas 4, the receiver 6 and the RF transmission lines 10 are electrically decoupled by the decouplers 12. A relatively large area of isolation is preferably formed in the PCB 8 by the isolation islands 20 in order to maximize the signal noise-isolating operation of the decoupling lines 14.

In operation, the PCB circuit 2 can encounter noise and electrical interference from a variety of internal and external sources. High-frequency receivers, such as those utilized in GNSS (e.g., GPS), are somewhat susceptible to degradation of performance due to such interference, with the potential for resulting inaccuracies in their positioning functions. The isolation islands 20 tend to be relatively free of such noise signals whereby the antennas 4 can be located relatively close to the receiver 6 without being subjected to excessive noise.

The relatively close proximities of the antennas 4 to the receiver 6 tend to minimize signal delays and electromagnetic interference (EMI) problems, which can be associated with greater separation and correspondingly longer RF connecting leads. Noise from such signal sources as multipath signals, PCB skin effect, power source fluctuations, phase noise and EMI in general tend to be effectively dissipated by the impedance (capacitive, inductive and/or resistive) of the decouplers 12. Effective decoupling improves signal quality from the antennas 4 to the receiver 6. In the case of GNSS systems, greater positioning accuracy can be achieved. Another benefit of decoupling the PCB circuit 2 is that the need for sophisticated filtering and processing functions, which are commonly performed by processors using Kalman and other filtering software techniques, can be eliminated or at least reduced. A further advantage of the decoupled PCB circuit 2 is that the PCB ground planes provide additional antenna areas for increasing the effectiveness of the antennas 4. Still further, the additional costs associated with separate circuit boards and standalone components can be avoided by utilizing the decoupled PCB 8.

III. First Alternative Aspect Tightly-Coupled PCB Circuit 52

Figure 2:
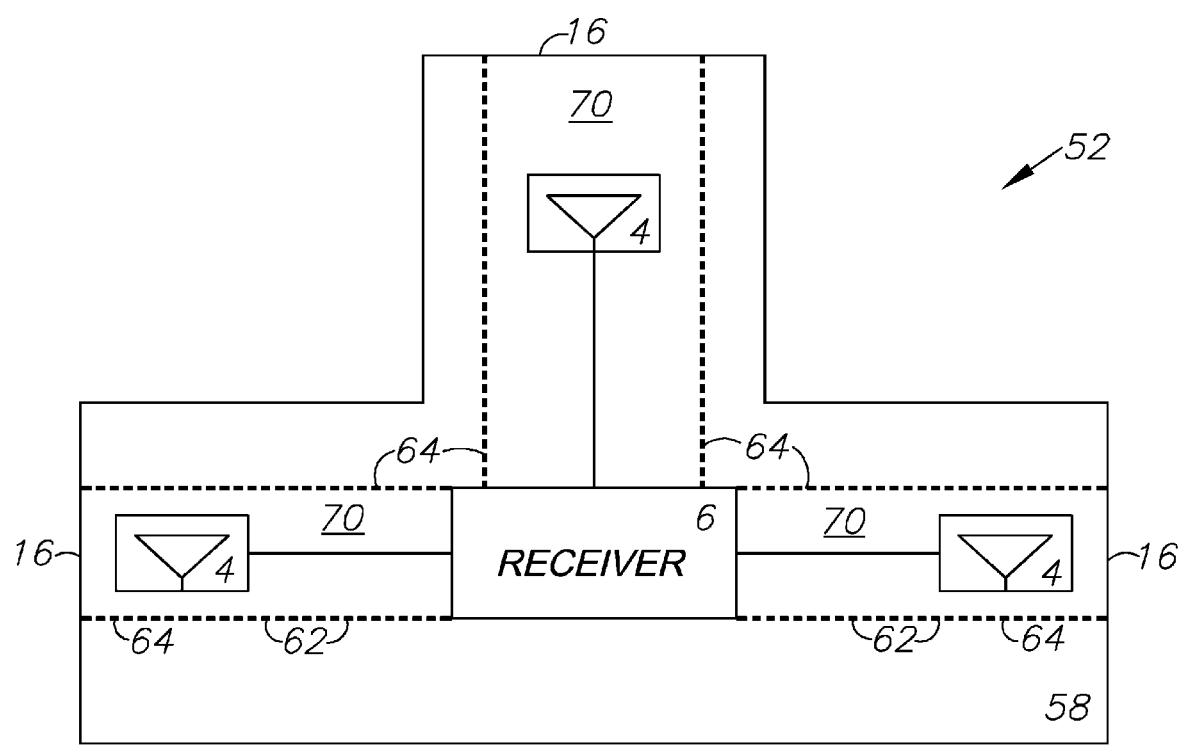
FIG. 2 is a schematic diagram of another tightly-coupled PCB circuit embodying another aspect of the present invention with three antennas trace-connected to a receiver on a single PCB.

A tightly-coupled PCB circuit 52 comprising a first alternative aspect or embodiment of the present invention is shown in FIG. 2 and includes an additional antenna 4. Such three-antenna GNSS receiver circuits can be utilized in vehicle guidance systems and machine control applications and are capable of determining vehicle and equipment attitude with respect to three axes.

As shown in FIG. 2, a PCB 58 can be alternatively configured for the third antenna 4 and can assume various other alternative configurations for additional components, including additional antennas, receivers, etc. Still further, additional circuits can be placed on PCBs which are tightly-coupled and create isolation islands according to the present invention. The tightly-coupled decoupled PCB circuit 52 includes decoupling lines 64 of decouplers 62, which form isolation islands 70 in which the antennas 4 are mounted in relatively noise-free isolation. Considerable cost savings can be achieved using the tight coupling of the present invention because the PCBs can be made smaller and components can be combined on single PCBs to form circuits that might have otherwise required physical isolation and separation among different components of a circuit.

IV. Second Alternative Aspect Tightly-Coupled PCB Circuit 102

Figure 3:
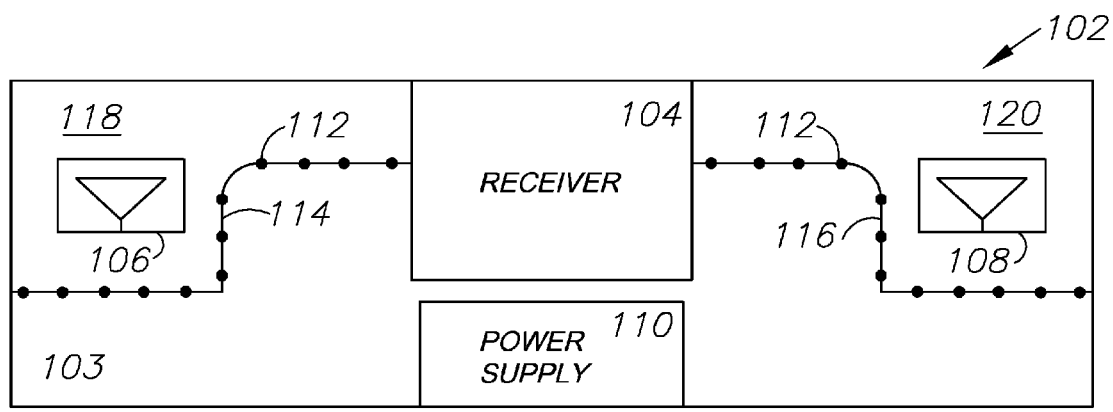
FIG. 3 is a top schematic diagram of another tightly-coupled PCB embodying another aspect of the present invention with a modified line of decoupling capacitors.
Figure 4:
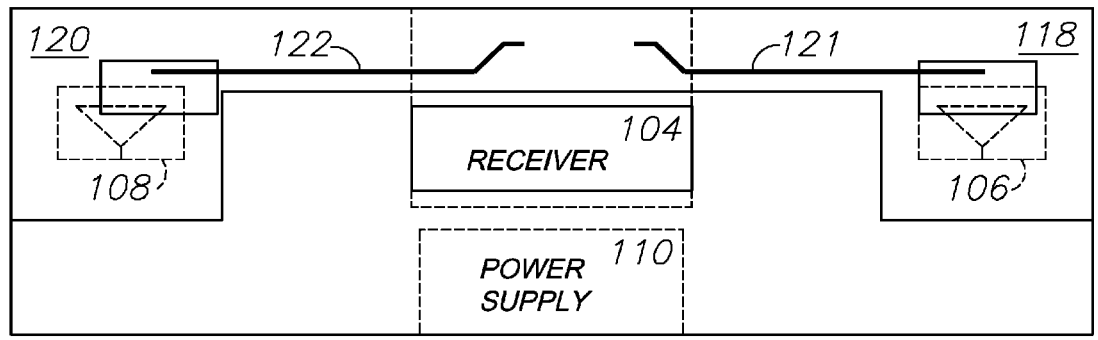
FIG. 4 is a bottom schematic diagram thereof.

A tightly-coupled PCB circuit 102 comprising a second alternative aspect or embodiment of the present invention is shown in FIGS. 3 and 4 and includes a PCB 103. The PCB circuit 102 includes a receiver 104, first and second GNSS antennas 106, 108 and a power supply 110. Multiple decoupling capacitors 112 form first and second decoupling lines 114, 116, which generally extend in opposite directions from the receiver 104 towards respective ends of the PCB 103 and define respective isolation islands 118, 120 for the antennas 106, 108 respectively. As shown in FIG. 4, first and second RF striplines or traces 121, 122 are surface-mounted on the bottom surface of the PCB 103 and extend from the receiver 104 to the antennas 106, 108 respectively.

V. Third Alternative Aspect Tightly-Coupled PCB Circuit 152

Figure 5:
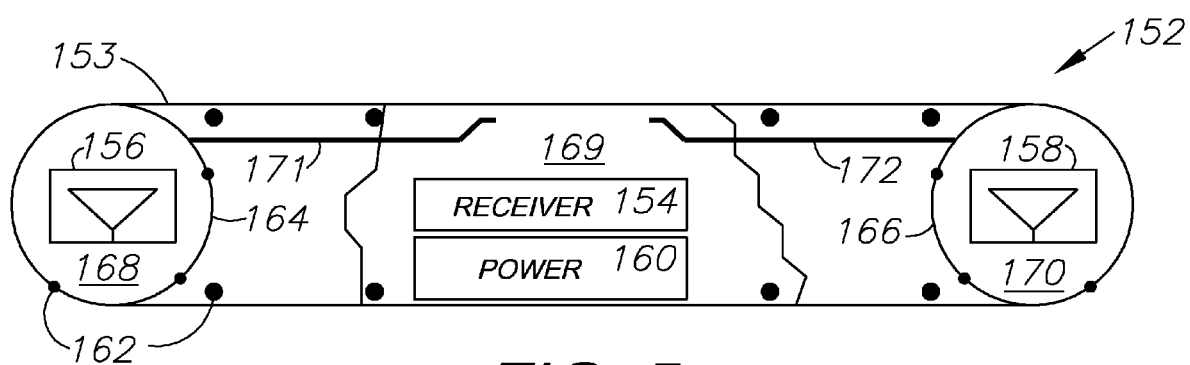
FIG. 5 is a top schematic diagram of another tightly-coupled PCB embodying another aspect of the present invention with a modified configuration and layout.
Figure 6:
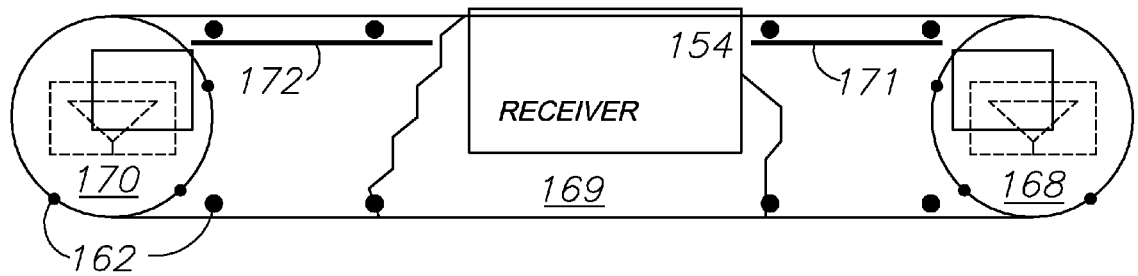
FIG. 6 is a bottom schematic diagram thereof.

A tightly-coupled PCB circuit 152 comprising a third alternative aspect or embodiment of the present invention is shown in FIGS. 5 and 6 and includes a PCB 153. The PCB circuit 152 includes a receiver 154, first and second GNSS patch antennas 156, 158 and a power supply 160. Multiple decoupling capacitors 162 form first and second decoupling lines 164, 166, which form generally circular isolation islands 168, 170 at respective ends of the PCB 153 for the antennas 156, 158 respectively. Additional decoupling capacitors 162 are provided adjacent to edges of the PCB 153. A central isolation island 159 is formed for the receiver 154 and a power supply 160. As shown in FIGS. 5 and 6, the isolation island 169 can have an irregular shape. Internal first and second RF striplines or traces 171, 172 are provided within the PCB 153 and extend from the central isolation island 169 to the antennas 156, 158 located in the isolation islands 168, 170 respectively. Alternatively, the RF traces 171, 172 can be surface-mounted.

It is to be understood that the invention can be embodied in various forms, and is not to be limited to the examples discussed above. For example, the PCBs and the isolation islands can be formed in a variety of configurations. Moreover, various components can be assembled in different configurations to form a wide variety of PCB circuits, which can effectively utilize the closely-coupled construction of the present invention with isolation islands. For example, multiple antennas and receivers can be provided. Although GNSS receivers and patch antennas are shown, other RF receivers and antennas can be utilized. The range of components and configurations which can be utilized in the practice of the present invention is virtually unlimited.

Having thus described the invention, what is claimed as new and desired to be secured by Letters Patent is:

1. A method of tightly coupling a printed circuit board (PCB), which method comprises the steps of:
   providing a PCB with multiple conductive layers;
   separating said conductive layers with insulating layers;
   providing a positive reference layer;
   providing a ground plane comprising a grounded reference layer;
   providing a signal layer;
   photoetching the signal layer to define a circuit;
   providing electrical components;
   connecting each electrical component to one or more layers;
   forming a decoupling line in said PCB; and
   forming an electrical isolation island in said PCB with said decoupling line.

2. The method of claim 1 wherein one of said components comprises a receiver, which method includes the additional steps of:
   providing said PCB with a perimeter;
   connecting said receiver to said PCB; and
   extending said decoupling line from said receiver to PCB perimeter.

3. The method of claim 2 wherein said components include an antenna, which method includes the additional steps of:
   providing an RF transmission line connecting said antenna to said receiver; and
   locating said antenna in said isolation island.

4. The method of claim 3, which includes the additional steps of:
   forming an optimal RF path from the antenna to the receiver, thereby creating a decoupling line; and
   forming said isolation island along said decoupling line path.

5. The method of claim 2, which includes the additional steps of:
   locating said receiver in an interior area of said PCB;
   providing a pair of said decoupling lines; and
   extending said decoupling lines from said receiver to said PCB perimeter.

6. The method of claim 1, which includes the additional step of:
   forming said decoupling line with a plurality of discrete decouplers each extending through said PCB layers.

7. The method of claim 3, which includes the additional steps of:
   providing said PCB with three sections each terminating at an outer end;
   locating said receiver centrally with said PCB sections extending outwardly therefrom;
   mounting an antenna in each of said sections in proximity to its outer end;
   extending a pair of said decoupling lines from said receiver to each said PCB section outer end; and
   forming an isolation island in each said PCB section with said antenna located therein.

8. A method of manufacturing a tightly-coupled PCB circuit with a power supply, a GNSS receiver and first and second GNSS antennas, which method comprises the steps of:
   providing a PCB with multiple conductive layers;
   separating said conductive layers with insulating layers;
   providing a positive reference layer;
   providing a ground plane comprising a grounded reference layer;
   providing a signal layer;
   photoetching the signal layer to define a circuit;
   providing said PCB with a perimeter;
   mounting said power supply and said GNSS receiver on said PCB;
   connecting said power supply and said GNSS receiver to said positive and grounded reference layers;
   providing multiple decoupling capacitors;
   connecting each said capacitors to multiple said PCB layers and electrically closely-coupling said PCB layers with said capacitors;
   determining optimal first and second RF paths from the antennas to the receiver;
   aligning multiple said decoupling capacitors along said optimal RF paths and thereby creating first and second decoupling lines each extending from said receiver to said PCB edge in proximity to a respective antenna;
   forming first and second isolation islands along said first and second decoupling line paths respectively;
   providing first and second RF transmission lines connecting said receiver to said first and second antennas respectively; and
   locating said first and second antennas in said first and second isolation islands respectively.

9. A tightly-coupled printed circuit board (PCB) circuit, which includes:
   multiple conductive layers;
   insulating layers separating said conductive layers;
   a positive reference layer;
   a ground plane comprising a grounded reference layer;
   a signal layer;
   a circuit photoetched in the signal layer;
   multiple electrical components each connected to one or more layers;
   a decoupling line in said PCB; and
   an electrical isolation island formed by said decoupling line in said PCB.

10. The circuit of claim 9, which includes:
    one of said components comprising a receiver;
    said PCB including a perimeter;

said receiver being connected to said PCB; and
said decoupling line extending from said receiver to said PCB perimeter.

11. The circuit of claim 10, which includes:
said components including an antenna located in said isolation island; and
an RF transmission line connecting said antenna to said receiver.

12. The circuit of claim 11, which includes:
an optimal RF path from the antenna to the receiver,
said decoupling line generally following said optimal RF path; and
said isolation island being formed along said decoupling line path.

13. The circuit of claim 10, which includes:
said receiver being located in an interior area of said PCB;
a pair of said decoupling lines; and
said decoupling lines extending from said receiver to said PCB perimeter.

14. The circuit of claim 9, which includes:
said decoupling line being formed with a plurality of discrete decouplers each extending through said PCB layers.

15. The circuit of claim 11, which includes:
said PCB having three sections each terminating at an outer end;
said receiver being located centrally with said PCB sections extending outwardly therefrom;
three antennas each mounted in a respective section in proximity to its outer end;
a pair of said decoupling lines each extending from said receiver to a respective PCB section outer end; and
three said isolation islands each located in a respective PCB section and each having a respective antenna located therein.

\* \* \* \* \*